July 23, 1968 L. L. LARSON 3,394,316

DIFFERENTIAL AMPLIFIER HAVING COMMON BASE OUTPUT STAGE OF VERY HIGH OUTPUT IMPEDANCE

Filed Jan. 29, 1965

LESTER L. LARSON
INVENTOR

BY

BUCKHORN, BLORE, KLARQUIST & SPARKMAN
ATTORNEYS

United States Patent Office 3,394,316

Patented July 23, 1968

3,394,316

DIFFERENTIAL AMPLIFIER HAVING COMMON BASE OUTPUT STAGE OF VERY HIGH OUTPUT IMPEDANCE

Lester L. Larson, Beaverton, Oreg., assignor to Tektronix, Inc., Beaverton, Oreg., a corporation of Oregon Filed Jan. 29, 1965, Ser. No. 429,034
4 Claims. (Cl. 330—30)

ABSTRACT OF THE DISCLOSURE

A differential amplifier circuit having a high common mode rejection ratio over a wide range of frequencies is described. The output stage of the amplifier circuit employs a pair of cascade common base transistor amplifiers connected in push-pull and providing an extremely high output impedance which for each transistor amplifier is approximately equal to the product of the collector resistance of the output transistor and the beta current gain of the other transistor in cascade therewith.

Figure 1:
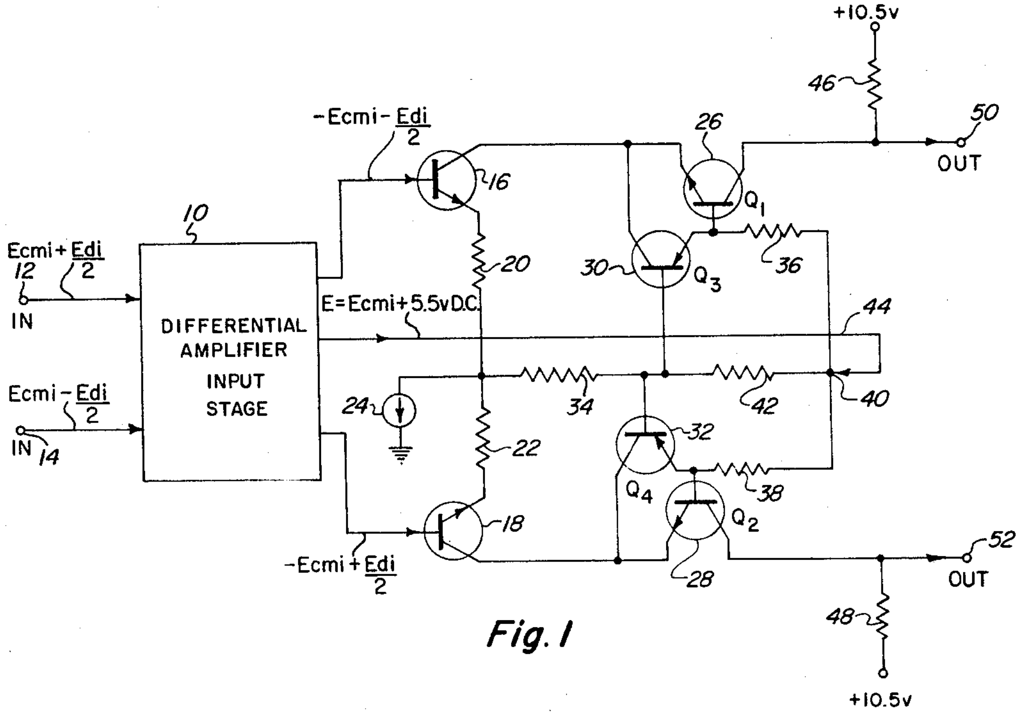

The subject matter of the present invention relates generally to electrical amplifier circuits having high output impedance, and in particular to a cascade common base transistor amplifier having an extremely high output impedance and to a differential amplifier having an output stage which employs a pair of such common base amplifiers connected in push-pull to provide the differential amplifier with a high common mode rejection ratio.

The amplifier of the present invention is especially useful when employed as part of a differential amplifier in the vertical amplifier system of a cathode ray oscilloscope. However, it should be noted that the cascaded common base amplifier of the present invention may be employed in other circuits than a differential amplifier and may be used as a single ended amplifier as well as in a push-pull amplifier. The cascade common base amplifier has a very high output impedance which is approximately equal to the collector resistance ($R_c$) of its output transistor times the beta current gain ($\beta$) of its second transistor. Such cascade common base amplifier also has a higher current gain which is approximately equal to the product of the $\beta$ of one transistor multiplied by the $\beta$ of the other transistor. In addition to these advantages a differential amplifier having an output stage which employs two of such cascade common base amplifiers connected in push-pull, has a higher common mode rejection ratio over a wider range of frequencies. In one embodiment of the differential amplifier of the present invention the common mode rejection ratio at low frequencies was 357,000 to 1, while such common mode rejection ratio at high frequencies of about 1 megacycle per second was still 21,600 to 1.

Briefly, one embodiment of the differential amplifier of the present invention includes an input stage and an output stage connected to the input stage by a pair of differential input terminals and a common mode input terminal. The output stage of the differential amplifier includes a pair of cascade common base amplifiers connected in push-pull, each of which includes an output transistor connected as a common base amplifier and a second transistor having its emitter connected to the base of such output transistor and its collector connected to the emitter of the output transistor. The emitters of the output transistors are each connected to a different one of the differential input terminals, while the bases of the second transistors are connected together to the common mode input terminal. As a result of this cascade transistor connection, the variations of collector resistance and collector-to-base capacitance of each of the output transistors are decreased by an amount related to the common emitter current gain ($\beta$) of the second transistor associated with such output transistor and the differential amplifier is provided with an extremely high output impedance. Thus, even if some common mode output voltage is transmitted through such output stage, it produces only a very small common mode output current due to such high output impedance.

It is therefore one object of the present invention to provide an improved electrical amplifier circuit having an extremely high output impedance.

An additional object of the invention is to provide a cascade common base transistor amplifier in which the collector resistance and the collector-to-base capacitance of its output transistor do not vary appreciably with changes in signal voltage applied to the input of such amplifier.

Another object of the present invention is to provide an improved amplifier circuit employing a common base output transistor and a second transistor having its emitter connected to the base of the output transistor and its collector connected to the emitter of such output transistor in order to produce a higher output impedance and a higher current gain.

A further object of the present invention is to provide an improved differential amplifier circuit having a higher common mode signal rejection ratio over a wider range of frequencies.

Still another object of the present invention is to provide an improved differential amplifier circuit having an output stage which employs a pair of cascade transistor amplifiers connected in push-pull to provide such output stage with a high output impedance which does not vary appreciably with changes in signal voltage.

Figure 2:
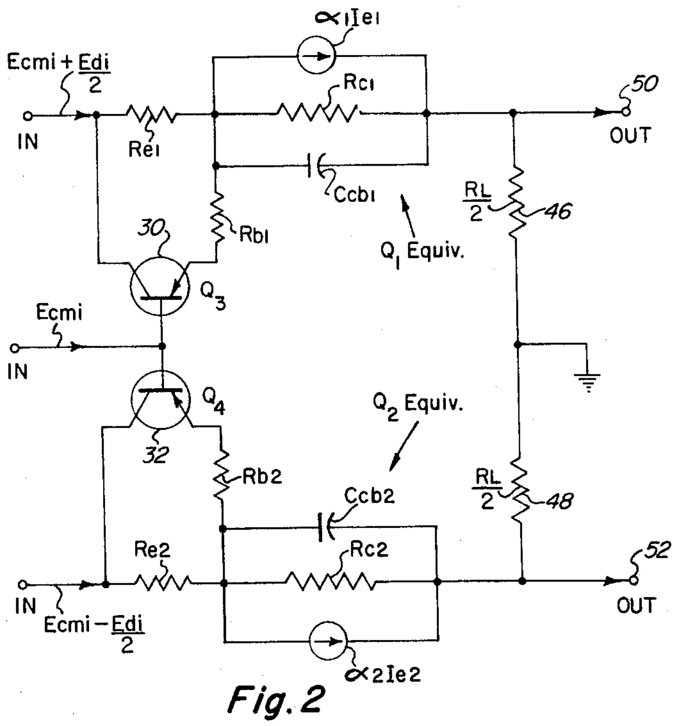

Other objects and advantages of the present invention will be apparent from the following detailed description of a preferred embodiment thereof and from the attached drawings of which:

FIG. 1 is a schematic diagram of a differential amplifier circuit having an output stage employing the cascade common base amplifier of the present invention; and FIG. 2 has an equivalent circuit of a portion of the output stage of the differential amplifier of FIG. 1.

The differential amplifier of the present invention includes an input stage 10 having a pair of input terminals 12 and 14 connected to the source of differential input signals $E_{di}$ which also produces a common mode input signal $E_{cmi}$. The input stage 10 has a pair of differential output terminals which are connected to the bases of different ones of a pair of transistors 16 and 18. Transistors 16 and 18 may be of the NPN type and are connected as common emitter amplifiers in push-pull with their emitters connected together through emitter load resistors 20 and 22, respectively, of 86.6 ohms each to a source 24 of substantially constant current of about 12 milliamperes. The collectors of transistors 16 and 18 are connected to the emitters of a pair of output transistors 26 and 28 which form part of the output stage of the differential amplifier and are connected in push-pull to transmit differential output signals from such output stage.

The output stage of the differential amplifier also includes a second pair of transistors 30 and 32 having their emitters connected to the bases of output transistor 26 and 28, respectively, and their collectors connected to the emitters of such output transistors. The second transistors 30 and 32 of the output stage are of a PNP type which is of opposite conductivity to the NPN type output transistors 26 and 28 so that as a result of such complementary symmetry the emitter-to-collector voltage of such second transistors quiescently forwardly biases the emitter-to-base junctions of the output transistors to render such output transistors conducting. The bases of the second transistors 30 and 32 are connected together in common to the D.C. current sources 24 through a coupling resistor 34 of 4.53 kilohms. The bases of the output transistors 26 and 28 are connected together through bias resistors 36 and 38 respectively of 2.61 kilohms each to a common terminal point 40. Another coupling resistor 42 of 1.87 kilohms is connected between the common terminal 40 and resistor 34 so that constant current source 24 supplies D.C. bias current for all of the transistors.

A third output terminal of the input stage 10 is connected to the common terminal 40 by lead 44 in order to apply a bootstrap signal voltage to such common terminal which is equal to the common mode input signal ($E_{cmi}$) plus a D.C. offset voltage of about 5.5 volts. The bootstrap voltage applied to the common input terminal 40 is supplied to the bases of the output transistors 26 and 28 in phase with the common mode input voltage applied through transistors 16 and 18 to the emitters of such output transistors. As a result the bootstrap signal effectively cancels such common mode input signal in a manner similar to that disclosed in copending U.S. patent application Ser. No. 392,420 entitled, "Bootstrap Cascade Differential Amplifier," filed Aug. 27, 1964 by Roy M. Hays.

The collectors of output transistors 26 and 28 are connected through load resistors 46 and 48, respectively, of about 248 ohms each to sources of positively D.C. supply voltage of +10.5 volts. The differential output signals produced across load resistors 46 and 48 are transmitted to a pair of output terminals 50 and 52 connected to the collectors of output transistors 26 and 28, respectively. Thus, the output transistors 26 and 28 operate as common base amplifiers for the differential input signal applied to their emitters. In a similar manner the second transistors 30 and 32 act as common base amplifiers for the differential signals applied to their emitters through the bases of the output transistors to provide negative voltage feedback to the emitters of such output transistors. However, the second transistors also operate as emitter follower amplifiers for the common mode bootstrap signal applied to their bases. The overall effect of the second transistors 30 and 32 is to increase the output impedance of the output stage to a value approximately equal to the collector resistance ($R_c$) of the output transistors 26 and 28 multiplied by the beta current gain ($\beta$) of such second transistors.

As shown in FIG. 2 the equivalent circuits of the first and second output transistors 26 and 28 of FIG. 1 includes a collector-to-base capacitance $C_{cb1}$ and $C_{cb2}$ connected in parallel with the collector resistance $R_{c1}$ and $R_{c2}$ associated therewith. Each of such equivalent circuits also includes a current generator whose value is equal to the common base current gain of the first and second output transistors $\alpha 1$ and $\alpha 2$ times the emitter current $I_{e1}$ and $I_{e2}$ of such transistors. The emitter resistance $R_{e1}$ and $R_{e2}$ and the base resistance $R_{b1}$ and $R_{b2}$ of the two output transistors are also shown. In addition, each of the collector load resistors 46 and 48 is a resistance $R_L/2$ which is equal to one-half the total load resistance of the output stage.

If the second transistors 30 and 32 were eliminated from the circuit of FIG. 1 the common mode rejection ratio (CMR) at low frequency would be equal to $$CMR_{lf}=\frac{G_{md}}{\frac{1}{R_{c1}}-\frac{1}{R_{c2}}}$$

where $G_{md}$ is the mutual conductance of the stage containing the transistors 26 and 28. In addition, it can also be shown that for frequencies greater than $$\frac{1}{2\pi(R_c \times C_{cb})}$$

the high frequency common mode rejection ratio $$CMR_{hf}=\frac{G_{md}}{2\pi f(C_{cb1}-C_{cb2})}$$

For example, if $R_{c1}=1$ megohm, $R_{c2}=1.1$ megohm, and $G_{md}=5000$ mhos, then the low frequency common mode rejection ratio, $CMR_{lf}$ is 50,000. Also if $C_{cb1}=2.5$ picofarads and $C_{cb2}=2.0$ picofarads at a frequency of 1 megacycle per second, the high frequency common mode rejection ratio, $CMR_{hf}$, is 1600.

However, when transistors 30 and 32 are added as shown in FIGS. 1 and 2, the low frequency common mode rejection ratio is $$CMR_{lf}=\frac{G_{md}}{\frac{1}{(\beta_3+1)R_{c1}}-\frac{1}{(\beta_4+1)R_{c2}}}$$

where $\beta_3$ and $\beta_4$ are the common emitter current gains of transistors 30 and 32 respectively. Similarly, the high frequency common mode rejection ratio of the circuit of the present invention is $$CMR_{hf}=\frac{G_{md}}{2\pi f\left[\frac{C_{cb1}}{\beta_3+1}-\frac{C_{cb2}}{\beta_4+1}\right]}$$

Thus, if the same component values are assumed as given in the previous example and $\beta_3=50$ and $\beta_4=150$, the low frequency common mode rejection ratio, $CMR_{lf}$ is 357,000 while the high frequency common mode rejection ratio, $CMR_{hf}$, at 1 megacycle is 21,600. The increases in common mode rejection ratio are due to a decrease in changes of the collector resistance and the collector capacitance by a factor approximately equal to the $\beta$ of the feedback transistors.

The cascade common base amplifier configuration of the present invention may also be employed as a single ended amplifier by connecting the common end of the bias resistance of the output transistor and the base of the second transistor to ground. Then an input signal applied to the emitter of the output transistor is amplified and transmitted as an output signal from the collector of such output transistor. In the single ended amplifier configuration, the circuit of the present invention has a much higher current gain than a conventional common base amplifier and such current gain is approximately equal to the product of the $\beta$ of the second transistor times the $\beta$ of its associated output transistor and may typically be on the order of 10,000. In addition, the output impedance of the single ended amplifier would have an extremely high value approximately equal to the collector resistance of the output transistor multiplied by the $\beta$ of the feedback transistor.

It will be obvious to those having ordinary skill in the art that many changes may be made in the details of the above-described preferred embodiment of the present invention not departing from the spirit of the invention. For example, while complementary symmetry is employed to advantage with the second transistor and output transistor being of opposite type, it is also possible to make these transistors of the same conductivity type by making appropriate changes in bias voltage. Therefore, the scope of the present invention should only be determined by the following claims.

I claim:

1. A differential amplifier circuit having a high common mode rejection ratio, comprising:

an input amplifier stage having a pair of input terminals, a pair of differential output terminals and a common mode output terminal;

an output amplifier stage including a first pair of semiconductor devices connected as common base amplifiers with their emitters connected to a different one of the differential output terminals of said input stage to apply a differential input signal and a common mode input signal to said emitters, and their collectors each connected to a different one of a pair of output terminals of the differential amplifier circuit;

said output stage also including a second pair of semiconductor devices having their bases connected together, said second devices having their collectors connected to the emitters of different ones of said first devices and their emitters connected to the bases of the associated ones of said first devices; and means connecting the bases of said first devices to the common mode output terminal of said input stage for applying a common mode signal to such bases which is similar in magnitude to the common mode signal applied to the emitters of said first devices.

2. A differential amplifier circuit having a high common mode rejection ratio, comprising:

an input amplifier stage having a pair of input terminals, a pair of differential output terminals and a common mode output terminal;

an output amplifier stage including a first pair of semiconductor devices connected as common base amplifiers with their emitters connected to a different one of the differential output terminals of said input stage to apply a differential input signal and a common mode input signal to said emitters, and their collectors each connected to a different one of a pair of output terminals of the differential amplifier circuit;

said output stage also including a second pair of semiconductor devices of opposite type conductivity than said first devices and having their bases connected together, said second devices having their collectors connected to the emitters of different ones of said first devices and their emitters connected to the bases of the associated ones of said first devices;

a pair of bias resistances connected in series between the bases of said first transistors; and means connecting the common connection of said pair of bias resistances to the common mode output terminal of said input stage for applying a bootstrap signal to such resistances which is similar in magnitude to the common mode signal applied to the emitters of said first devices but differs by a substantially constant amount of D.C. offset voltage.

3. A differential amplifier circuit having a high output impedance and a high common mode rejection ratio, comprising:

an input amplifier stage having a pair of input terminals, a pair of differential output terminals and a common mode output terminal;

an output amplifier stage including a first pair of transistors connected as common base amplifiers with their emitters each connected to a different one of the differential output terminals of said input stage to apply a differential input signal and a common mode input signal to said emitters, and their collectors each connected to a different one of a pair of output terminals of the differential amplifier circuit;

said output stage also including a second pair of transistors connected in cascade with said first transistors and having their bases connected together, said second transistors having their collectors connected to the emitters of different ones of said first transistors and their emitters connected to the base of the associated ones of said first transistors;

a pair of load impedances connected to the collectors of said first transistors;

a pair of bias resistances connected in series between the bases of said first transistors; and means connecting the common connection of said bias resistances to the common mode output terminal of said input stage for applying a bootstrap signal to the bases of said first transistors which is similar in magnitude to the common mode signal applied to the emitters of said first transistors but differs by a substantially constant amount of D.C. offset voltage.

4. A differential amplifier circuit having a high output impedance and a high common mode rejection ratio, comprising:

an input amplifier stage having a pair of input terminals, a pair of differential output terminals and a common mode output terminal;

an output amplifier stage including a first pair of transistors connected as common base amplifiers with their emitters each connected to a different one of the differential output terminals of said input stage to apply a differential input signal and a common mode input signal to said emitters, and their collectors each connected to a different one of a pair of output terminals of the differential amplifier circuit;

said output stage also including a second pair of transistors of opposite type conductivity from said first transistors connected in cascade with said first transistors and having their bases connected together, said second transistors having their collectors connected to the emitters of different ones of said first transistors and their emitters connected to the bases of the associated ones of said first transistors;

a source of substantially constant bias current connected to the bases of said transistors;

a pair of load impedances connected to the collectors of the first transistors;

a pair of bias resistances connected in series between the bases of said first transistors;

a coupling resistance connected between the common connection of said bias resistances and the bases of the second transistors; and means connecting the common connection of said pair of bias resistances and said coupling resistance to the common mode output terminal of said input stage for applying a bootstrap signal to the bases of the first and second transistors which is similar in magnitude to the common mode signal applied to the emitters of said first transistors but differs by a substantially constant amount of D.C. offset voltage.

References Cited

UNITED STATES PATENTS 2,733,303 1/1956 Koenig ---------- 330—30 XR

FOREIGN PATENTS 594,479 1959 Italy.

ROY LAKE, *Primary Examiner.*

N. KAUFMAN, *Assistant Examiner.*